(12) United States Patent
Anderson et al.

(10) Patent No.: US 6,962,838 B2
(45) Date of Patent: Nov. 8, 2005

(54) HIGH MOBILITY TRANSISTORS IN SOI AND METHOD FOR FORMING

(75) Inventors: Brent A. Anderson, Jericho, VT (US); Xavier Baie, Somers, NY (US); Randy W. Mann, Jericho, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 10/447,579

(22) Filed: May 29, 2003

(65) Prior Publication Data

US 2003/0232467 A1 Dec. 18, 2003

Related U.S. Application Data

(62) Division of application No. 09/683,656, filed on Jan. 30, 2002, now Pat. No. 6,624,478.

(51) Int. Cl.⁷ .............................................. H01L 21/00
(52) U.S. Cl. ...................................... 438/149; 438/164
(58) Field of Search ................................. 438/149, 164, 438/479, 517; 257/353, 347, 396

(56) References Cited

U.S. PATENT DOCUMENTS

| | | | |
|---|---|---|---|
| 3,514,845 A | | 6/1970 | Legat et al. |
| 3,600,651 A | | 8/1971 | Duncan |
| 4,508,579 A | | 4/1985 | Goth et al. |
| 4,688,073 A | | 8/1987 | Goth et al. |
| 4,743,565 A | | 5/1988 | Goth et al. |
| 5,031,007 A | | 7/1991 | Chaffin et al. |
| 5,270,265 A | * | 12/1993 | Hemmenway et al. ...... 438/404 |
| 6,274,907 B1 | * | 8/2001 | Nakagawa .................. 257/354 |
| 2003/0077882 A1 | * | 4/2003 | Shih et al. .................. 438/478 |

* cited by examiner

Primary Examiner—Phat X. Cao
Assistant Examiner—Theresa T. Doan
(74) Attorney, Agent, or Firm—Schmeiser, Olson & Watts; William D. Sabo

(57) ABSTRACT

The present invention provides a device design and method for forming Field Effect Transistors (FETs) that have improved performance without negative impacts to device density. The present invention forms high-gain p-channel transistors by forming them on silicon islands where hole mobility has been increased. The hole mobility is increased by applying physical straining to the silicon islands. By straining the silicon islands, the hole mobility is increased resulting in increased device gain. This is accomplished without requiring an increase in the size of the devices, or the size of the contacts to the devices.

17 Claims, 14 Drawing Sheets

HIGH MOBILITY TRANSISTORS IN SOI AND METHOD FOR FORMING

This application is a divisional of Ser. No. 09/683,656; filed on Jan. 30, 2002 now U.S. Pat. No. 6,624,478.

BACKGROUND OF THE INVENTION

1. Technical Field

The present invention relates generally to the field of semiconductor manufacturing and, more specifically, to a method for high mobility field effect transistors.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in CMOS technologies, such as the in the design and fabrication of field effect transistors (FETs). FETs are used in almost all types of integrated circuit design (i.e., microprocessors, memory, etc.) As device densities are increased, concomitant increases in electric fields result in decreased electron and hole mobility, in conflict with the desire for increased switching speed of the FETs.

Thus, there is a need for improved device structures and methods of fabrications that provide for high performance devices without negative impacts to device density.

DISCLOSURE OF INVENTION

Accordingly, the present invention provides a device design and method for forming Field Effect Transistors (FETS) that have improved performance without negative impacts to device density. The present invention forms high-gain p-channel transistors by forming them on silicon islands where hole mobility has been increased. The hole mobility is increased by applying physical straining to the silicon islands. By straining the silicon islands, the hole mobility is increased resulting in increased device gain. This is accomplished without requiring an increase in the size of the devices, or the size of the contacts to the devices.

The invention forms silicon islands from a silicon-on-insulator (SOI) layer. The silicon islands are preferably defined to minimize the size of the islands and to increase and equalize the amount of induced strain that is applied to the silicon islands during processing. For example, strain is applied by growing oxide at the edges of the silicon islands. The oxide causes the silicon islands to flex upward, increasing the strain on the silicon islands. Normally, devices positioned far away from the edges of such silicon islands will experience very little strain, and hence, ordinary hole mobility. Devices near the edge of silicon islands will experience large strain, and hence will enjoy significant mobility enhancement. In the present invention, the dimensions of the silicon islands are minimized and the strain caused by the oxide growth is applied across the silicon island and thus effects all transistors formed in the island. Thus, PFETs formed in the strained silicon island have an increased hole mobility and hence an increased gain. Furthermore, the gain of the PFETs caused by the device strain is equalized, resulting in equalized device performance.

The strained silicon islands are connected together to reduce the number of contacts needed to connect the transistors. The strained silicon islands are connected by forming conductive bridges in the trenches between the strained silicon islands. For example, polysilicon bridges are formed in the trenches between strained silicon islands. In addition, a second conductive top layer can be formed atop the conductive bridges to further increase the conductivity between islands. For example, silicide can be formed atop the conductive bridges, further increasing the conductivity between adjacent conductive bridges.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

Figure 1:
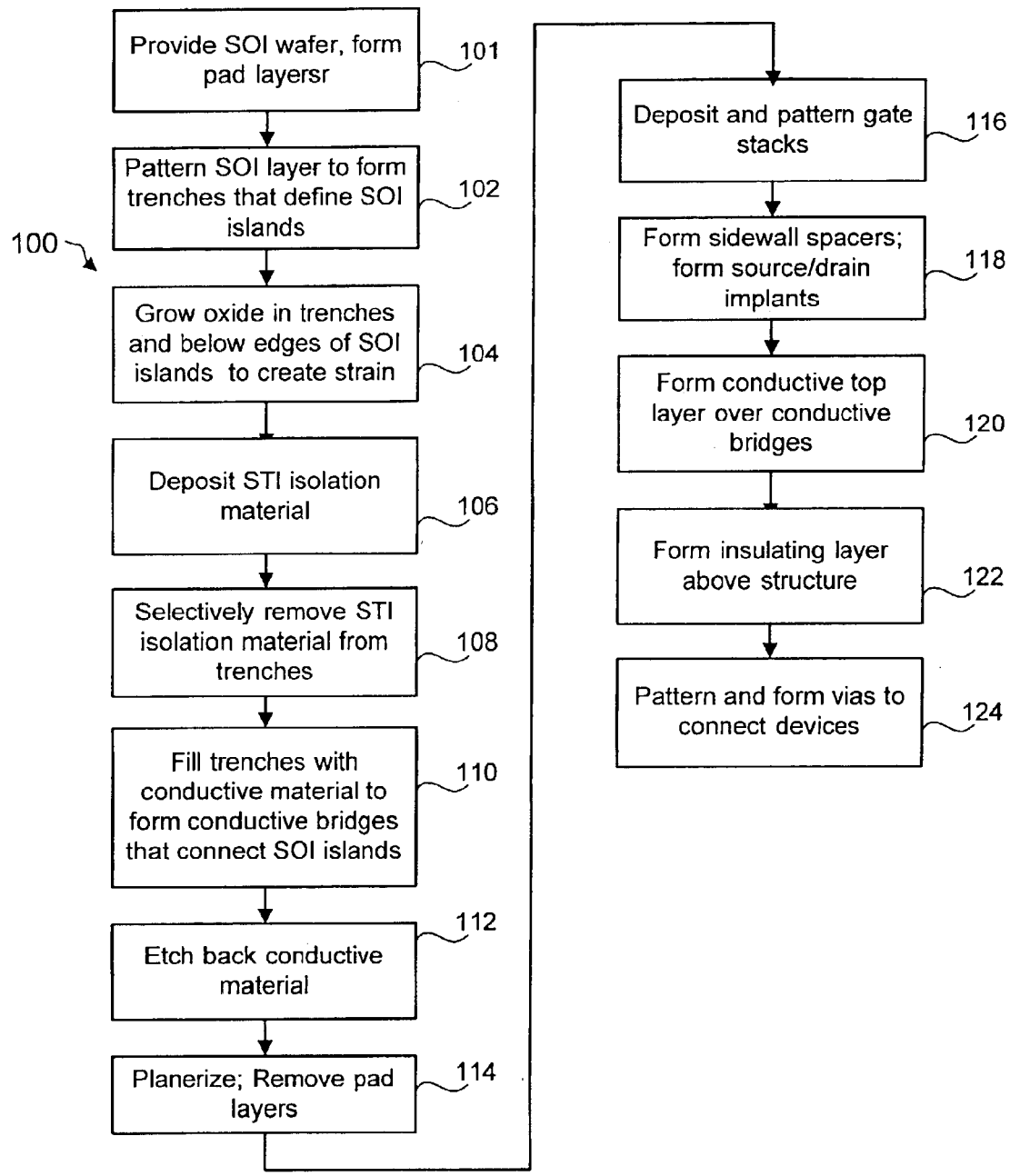
FIG. 1 is a flow diagram illustrating a fabrication method of the invention.

The present invention provides a device design and method for forming Field Effect Transistors (FETs) that have improved performance without negative impacts to device density. The present invention forms high-gain p-channel transistors by forming them on silicon islands where hole mobility has been increased. The hole mobility is increased by applying physical straining to the silicon islands. By straining the silicon islands, the hole mobility is increased resulting in increased device gain. This is accomplished without having to increase the size of the devices, or the size of the contacts to the devices.

The invention forms silicon islands from a silicon-on-insulator (SOI) layer. The silicon islands are preferably defined to minimize the size of the islands and to increase and equalize the amount of induced strain that is applied to the silicon islands during processing. For example, strain is applied by growing oxide at the edges of the silicon islands. The oxide causes the silicon islands to flex upward, increasing the strain on the silicon islands. By minimizing the size of the silicon islands, the strain caused by the oxide growth is applied across the silicon island and thus effects all transistors formed in the island. Thus, PFETs formed in the strained silicon island have an increased hole mobility and hence an increased gain. Furthermore, the gain of the PFETs caused by the device strain is equalized, resulting in equalized device performance.

The strained silicon islands are connected together to reduce the number of contacts needed to connect the transistors. The strained silicon islands are connected by forming conductive bridges in the trenches between the strained silicon islands. For example, polysilicon bridges are formed in the trenches between strained silicon islands. In addition, a second conductive top layer can be formed atop the conductive bridges to further increase the conductivity between islands. For example, silicide can be formed atop the conductive bridges, further increasing the conductivity between adjacent conductive bridges.

The foregoing and other advantages and features of the invention will be apparent from the following more particular description of a preferred embodiment of the invention, as illustrated in the accompanying drawings.

The present invention may be readily adapted to a variety of methods of fabricating transistors, such as the many complimentary metal oxide semiconductor (CMOS) fabrication methods. It will be understood by one of ordinary skill in the art that the invention is not limited to the specific structures illustrated in the drawings or to the specific steps detailed herein. It will also be understood that the invention is not limited to use of any specific dopant types provided that the dopant types selected for the various components are consistent with the intended electrical operation of the device.

Turning now to FIG. 1, exemplary method 100 for forming CMOS FETs in accordance with the present invention is illustrated. Generally, fabrication method 100 of present invention may forms CMOS PFETs that have increased hole mobility in the channel to increase device performance. The hole mobility is increased by applying physical straining to the silicon islands. The strained silicon islands are connected together to reduce the number of contacts needed to connect the transistors.

In most semiconductor devices, both NFETs and PFETs are manufactured together on a single wafer. Because method 100 only improves the mobility of holes, it will generally be desirable to limit the formation of minimized silicon islands to areas where PFETs are formed, while forming NFETs in other areas of the wafer using more traditional processing.

The first step 101 of FIG. 1 is to provide a suitable silicon-on-insulator (SOI) wafer, and to form pad layers on the SOI wafer. A silicon-on-insulator wafer includes a buried dielectric layer, typically a buried oxide layer, and a silicon layer, generally referred to as an SOI layer, above the buried dielectric layer. The SOI wafer can be formed using any suitable method, such as implanting the buried dielectric in a single crystal silicon wafer, or forming the SOI layer above an already formed dielectric layer. Typically, the buried dielectric layer will be between 50 to 150 nm and the SOI layer will be between 20 to 120 nm thick. In one embodiment, the pad layers will comprise a pad oxide layer and a pad nitride layer, with each of the pad layers between 10 and 100 nm each.

Figure 2:
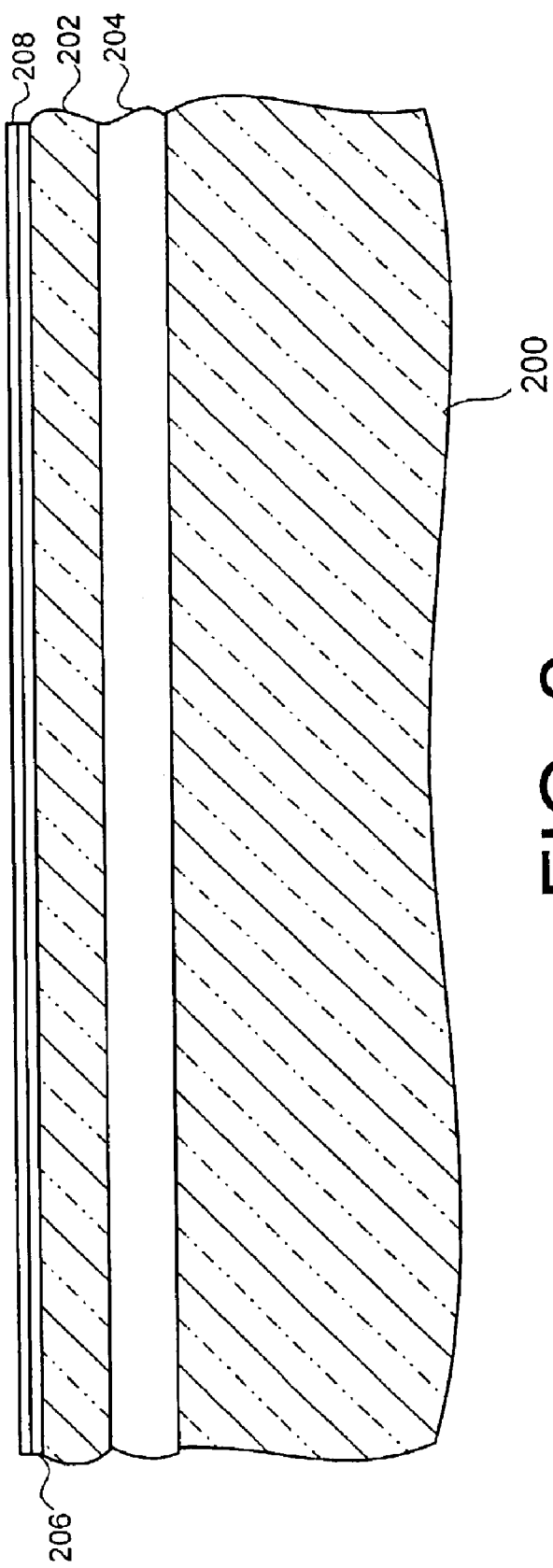
FIGS. 2–14 are cross-sectional side views of an embodiment of a semiconductor structure of the invention during the fabrication method of FIG. 1.

Turning now to FIG. 2, an exemplary wafer portion 200 is illustrated that includes a SOI layer 202 formed over a buried insulator layer 204. On the SOI layer are formed two pad layers, specifically, a silicon nitride layer 208 and a silicon dioxide layer 206. The wafer portion 200 will be used to illustrated the formation of PFET devices in accordance with the present invention.

Returning to FIG. 1, the next step 102 is to pattern the SOI layer to form trenches that define SOI islands. This etch process breaks up the SOI layer into numerous islands, with each island having a minimized size to increase the amount of strain which will be applied to the island, and to equalize the strain to all areas of the island where transistors are to be formed. This can be accomplished by forming additional trenches between devices to "break up" the larger SOI islands.

Specifically, the SOI islands are formed to have minimum dimensions in the direction of current flow. Thus, it will be preferable to form the islands as small as possible, extending beyond the gate edges of the transistors only enough to allow for sufficient tolerances during patterning. However, in some cases, it will be desirable to form two or more devices adjacent to each other in the direction of current flow. In the direction perpendicular to current flow, the SOI islands can be defined in any suitable dimension to achieve desired FET width. By defining the SOI islands at these dimensions, the induced strain caused by later processing will be applied across the island, increasing the gain of all PFETs formed in the island.

It should again be noted that it will generally be desirable to form the NFETs of the wafer on traditional sized islands, as the induced strain accomplished by method 100 does not generally effect the mobility of electrons, the majority carriers for NFET devices. Thus, in step 102, islands of reduced size are formed where PFET devices will be formed, while islands of traditional size are formed where NFET devices will be formed. Stated another way, the additional trenches added to define the minimized SOI islands in PFET areas will not generally be etched in NFET areas.

In one embodiment, the etch process used to define the SOI islands is the same etch process used to define isolation regions. Thus, SOI islands and shallow trench isolation (STI) can be defined with one etch process. This minimizes process complexity while still providing fabrication flexibility. Additionally, other trenches can be formed at this time, such as trenches used to form substrate contacts.

Figure 3:
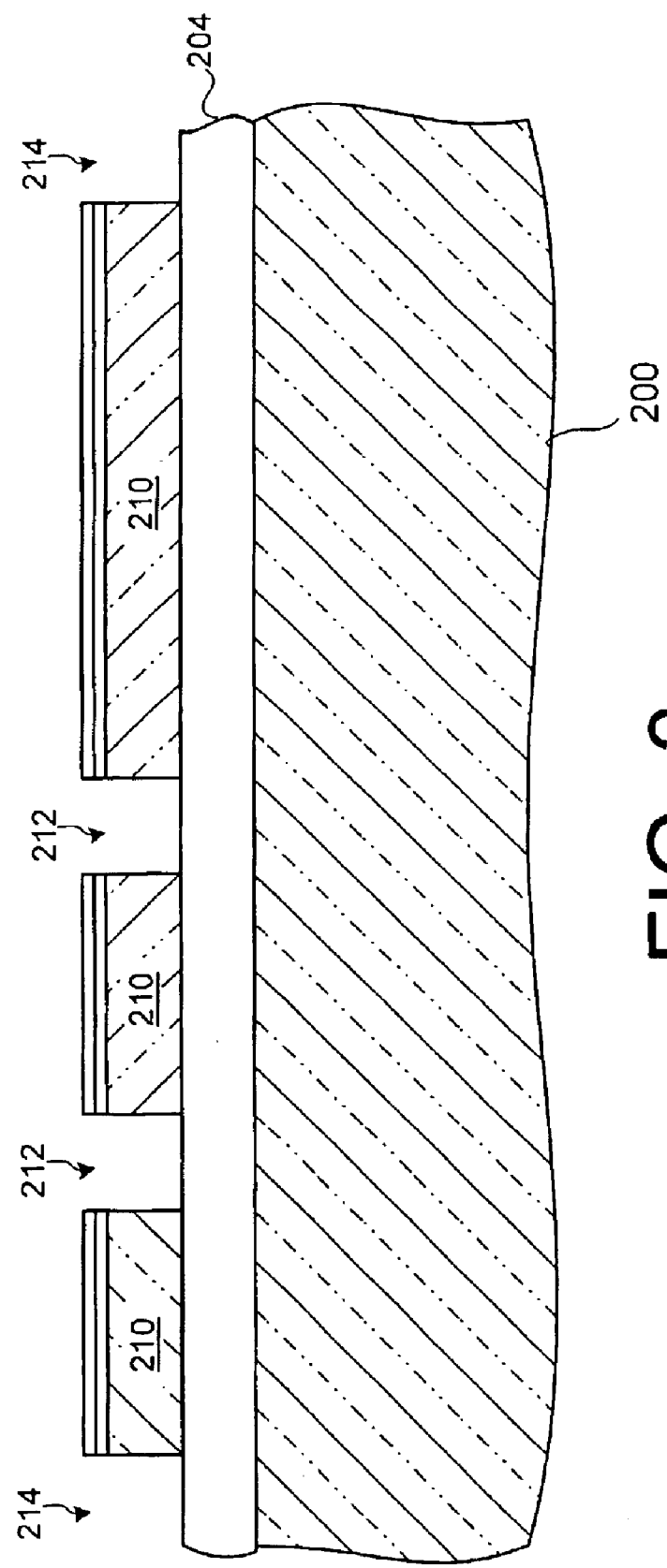

Turning now to FIG. 3, the wafer portion 200 is illustrated after the SOI layer 202 has been patterned to define several SOI islands. In particular, the SOI layer 202 has been patterned to form three SOI islands 210. The SOI islands are separated by trenches 212 which were formed in the patterning process. Additionally, the exemplary wafer portion 200 also illustrates portions of two STI trenches 214 that were formed in the same process.

Returning to FIG. 1, the next step 104 is to grow oxide in the trenches to create strain in the SOI islands. In particular, the wafer is subjected to a thermal oxidation process. This thermal oxidation process causes silicon dioxide to form on exposed surfaces of silicon through out the wafer. This includes the sidewalls of the trenches formed between the SOI islands. This silicon dioxide growth also undercuts the edges of the SOI islands, beginning at the trenches and working inward. Because the volume of silicon doubles as it becomes silicon dioxide, this growth causes the edges of the SOI islands to be pushed upward. This creates strain upon the silicon island.

The oxide growth used to create strain on the SOI island can be a specific growth added for this purpose, or a growth that also is used to passivate the edges of STI trenches to remove dangling bonds and improve the electronic properties of the silicon.

Because the SOI islands are formed with reduced dimensions, the silicon dioxide-induced strain will be greater in the interior of each island than it would have been with one large island. Thus, all p-channel devices in the island will have increased hole mobility, and hence increased gain.

Figure 4:
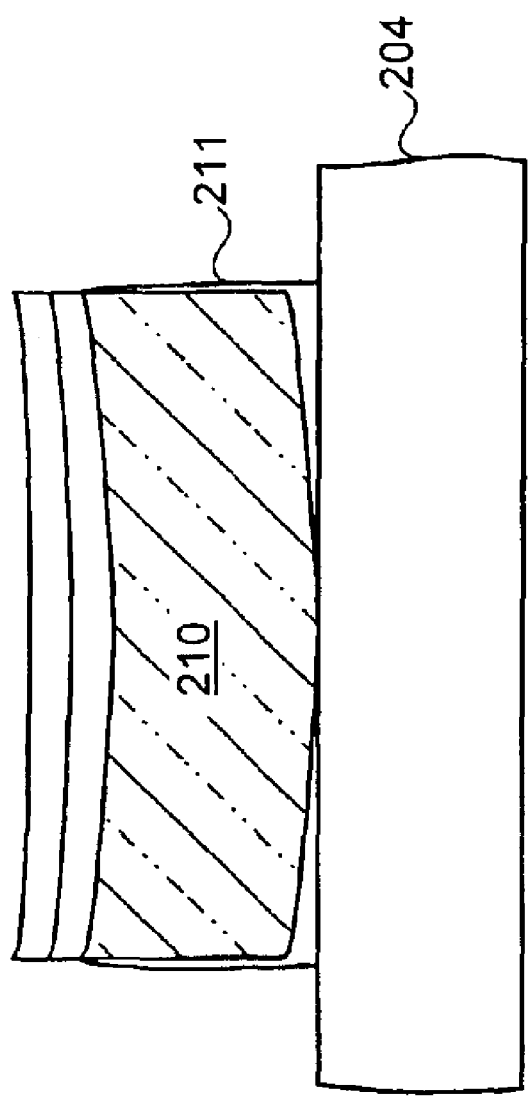

Turning now to FIG. 4, a smaller wafer portion is illustrated. Specifically, a portion of the buried insulator layer 204, along with a strained SOI island 210 is illustrated. FIG. 4 illustrates how thermal oxidation forms silicon dioxide 211 on the sides of the silicon island and under the edges of the silicon island. The growth of silicon dioxide under the edges of the SOI island causes the edges of the SOI island to be pushed upward. This effect is illustrated in FIG. 4, where it is exaggerated for clarity. The silicon dioxide growth thus results in a physical strain that is applied across the SOI island 210.

Returning to FIG. 1, the next step 106 is to deposit the STI dielectric. This dielectric can be any suitable dielectric, such as silicon nitride or silicon dioxide. The STI dielectric is deposited to fill the trenches, including the trenches between SOI islands and STI trenches.

Figure 5:
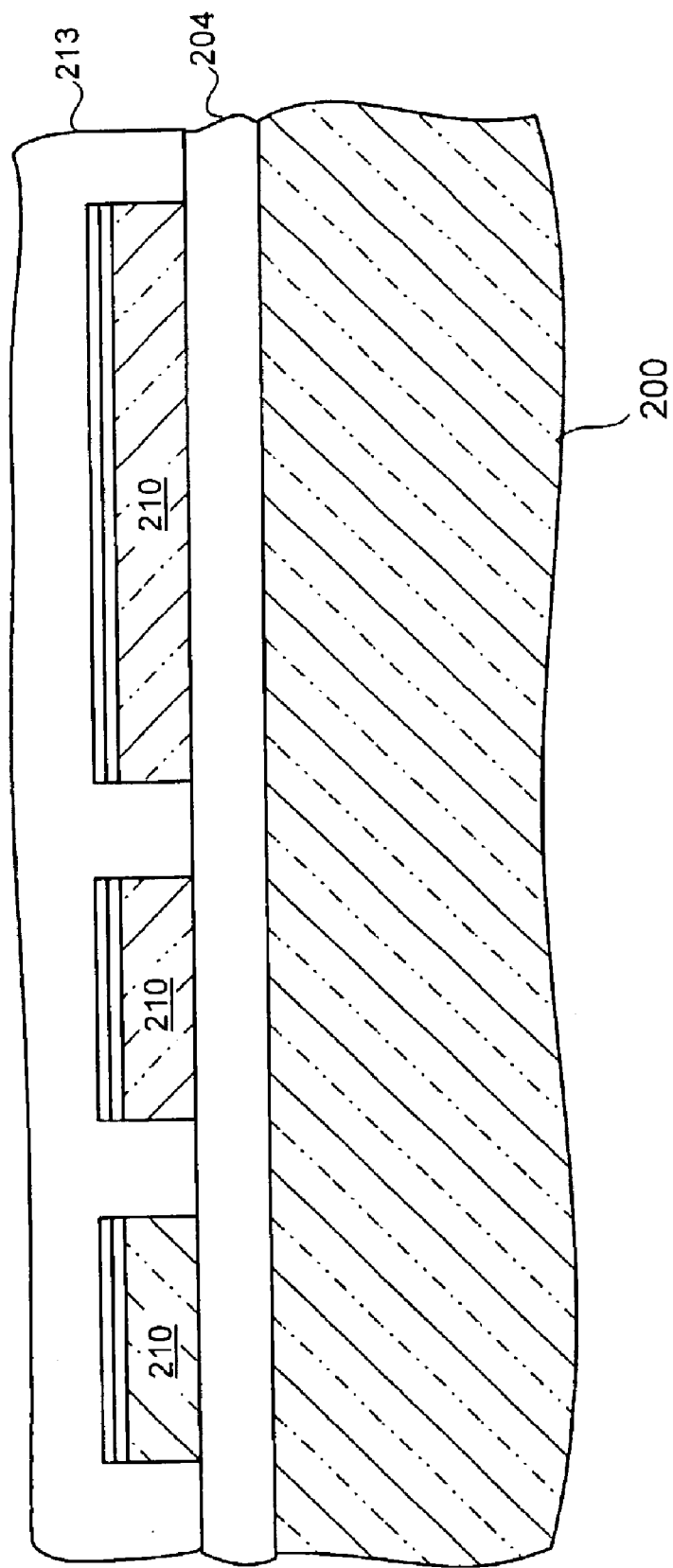

Turning now to FIG. 5, the wafer portion 200 is illustrated after the deposition of a STI oxide 213. The STI dielectric covers wafer filling the trenches 212 and the STI trenches 214.

Returning to FIG. 1, the next step 108 is to selectively remove STI dielectric from the trenches between SOI islands, while leaving the STI dielectric in the STI trenches. This is preferably done by depositing and patterning photoresist to selectively expose the STI dielectric in non-STI areas where PFETs are to be formed. The STI dielectric can be selectively removed using a selective etch. The resist used to define the STI dielectric can be a specific resist added for this process. In another embodiment, the resist used can be resist that is also used to define elements such as substrate contacts that are formed to extend through the STI dielectric, SOI layer and buried insulator layer to provide a contact to the underlying substrate.

In some cases, this etch process removes all the STI dielectric from the trenches. In other embodiments, it may be desirable to leave a portion of the STI dielectric in the trenches between SOI islands. By leaving a portion of the STI dielectric at the bottom of the trenches, bodies of FETs in common silicon islands can be more effectively isolated without requiring a deep source or drain to effect such isolation. This would be accomplished by timing the etch to only remove a portion of the STI dielectric.

Figure 6:
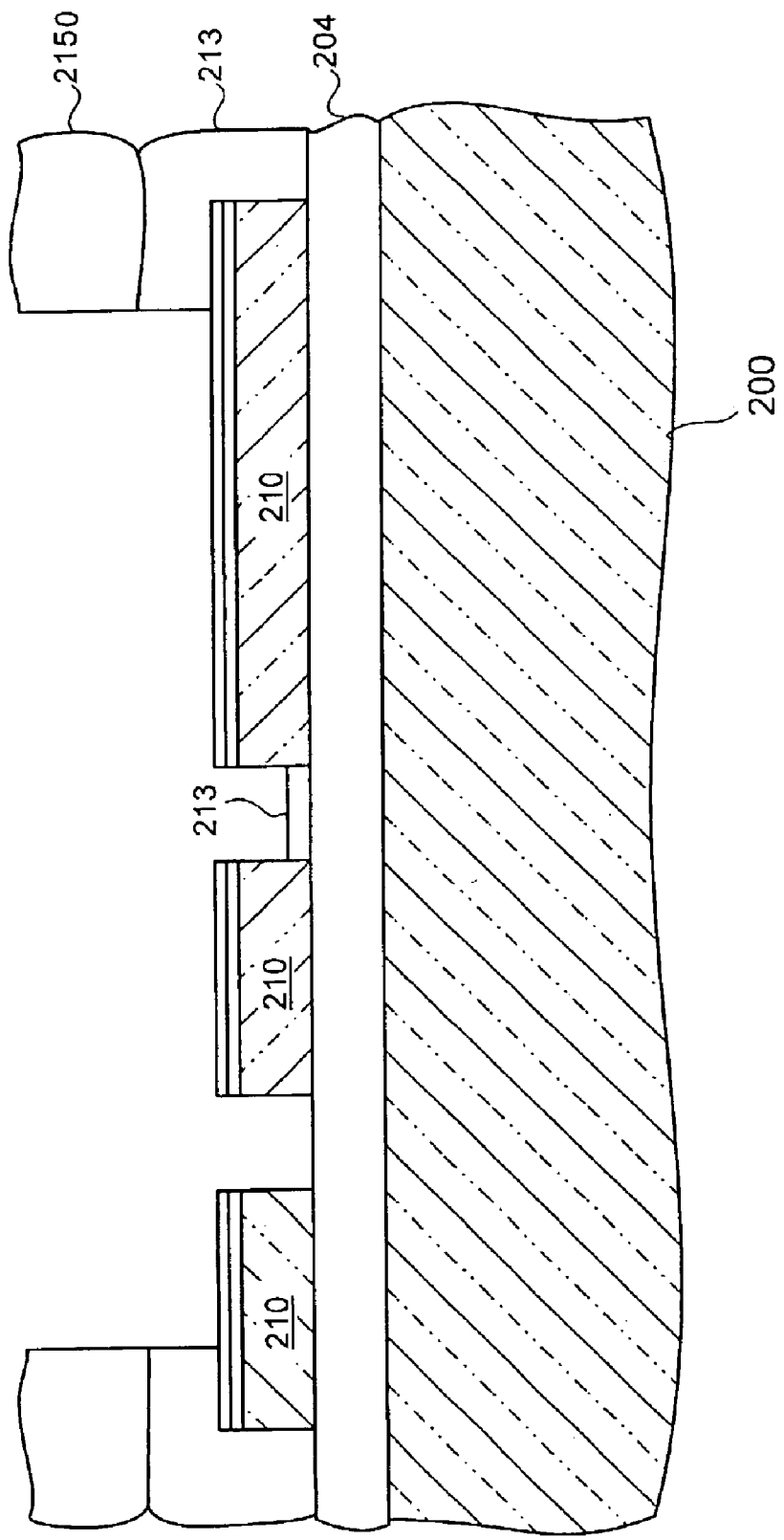

Turning flow to FIG. 6, the wafer portion 200 is illustrated after the STI dielectric 213 has been selectively removed by depositing and patterning a resist 2150, and etching the STI dielectric selective to the patterned resist 2150. This removes the STI dielectric 213 from between the SOI islands 210, while the STI dielectric 213 remains in the STI trench area. In one trench, a portion of the STI dielectric 213 is shown remaining in the trench between the SOI islands to illustrate the alternate embodiment.

Figure 7:
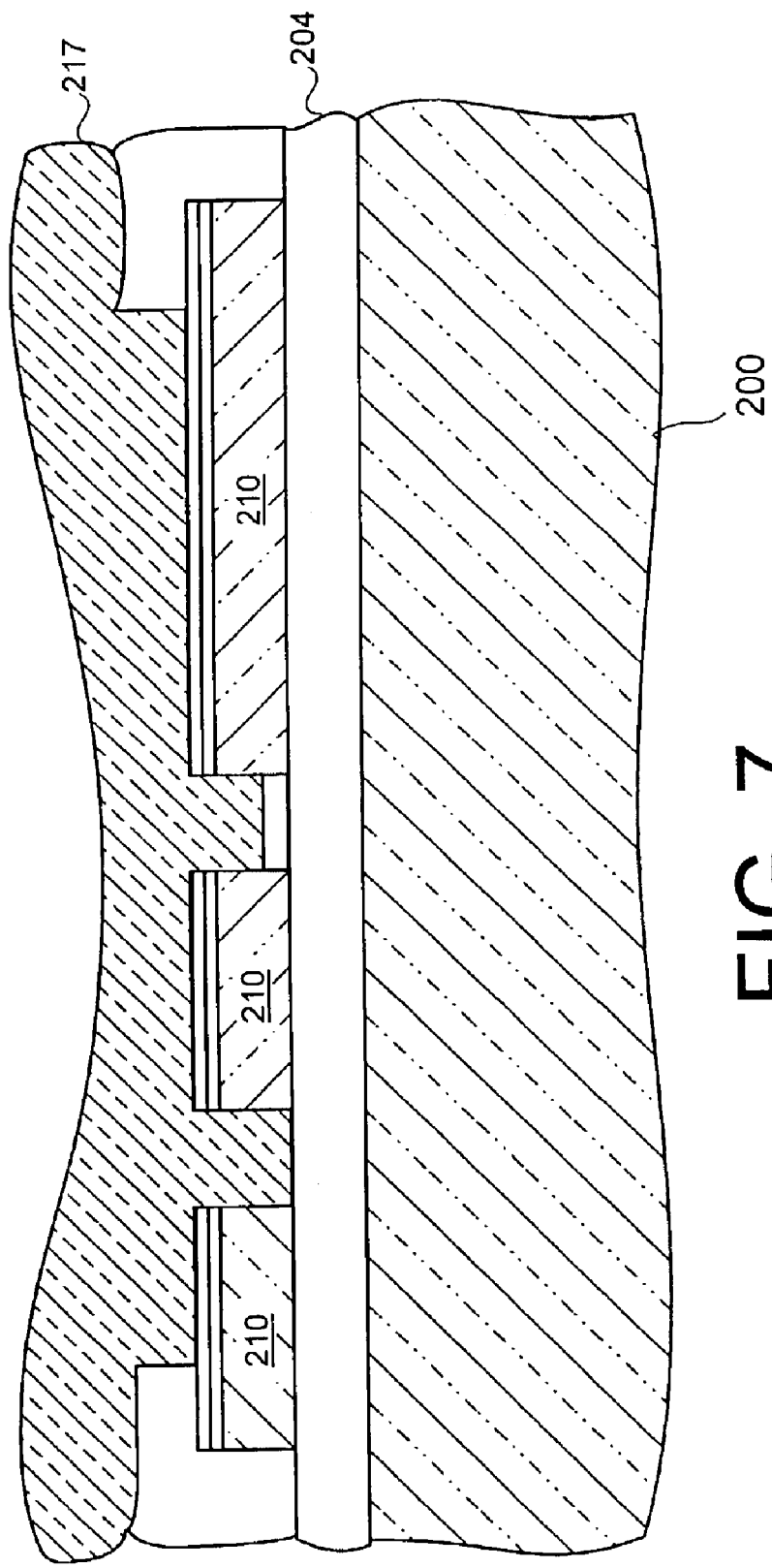

Returning to FIG. 1, the next step 110 is to fill trenches between the SOI islands with conductive material. This material forms the conductive bridges between SOI islands. This material can be any suitable conductive, non-insulative, material, including both regular conductor and semiconductor type materials. Generally, it would be preferred to use undoped polysilicon to form the conductive bridges. The conductive bridges will be used to partially connect the SOI islands, making it unnecessary to provide individual contacts to each SOI island. In one embodiment, the conductive material used could be the same conductive material used to form substrate contacts. The conductive material fills the exposed trenches between SOI islands, but does not fill trenches that are filled with remaining STI dielectric. Turning now to FIG. 7, the wafer portion 200 is illustrated after the deposition of the conductive material 217.

Returning to FIG. 1, the next step 112 is to etch back the conductive material. This removes the conductive material from between the SOI island trenches. In some embodiments, it will be desirable to leave the conductive material in other locations for other uses. For example, where the conductive material is polysilicon being used to form substrate contacts, it will be desirable to protect the polysilicon in the contact areas with a suitable resist or mask before etching the photoresist.

The etch back preferably lowers the top surface of the conductive material to approximately equal the top surface of the SOI islands to keep the subsequent contact processes and photolithographic steps on surfaces as close to planar as possible. In other embodiments, the conductive material could be further raised to enable lower resistance source-drain contacts (e.g., raised source/drains) or further depressed to reduce capacitive coupling to overlaying interconnects.

Figure 8:
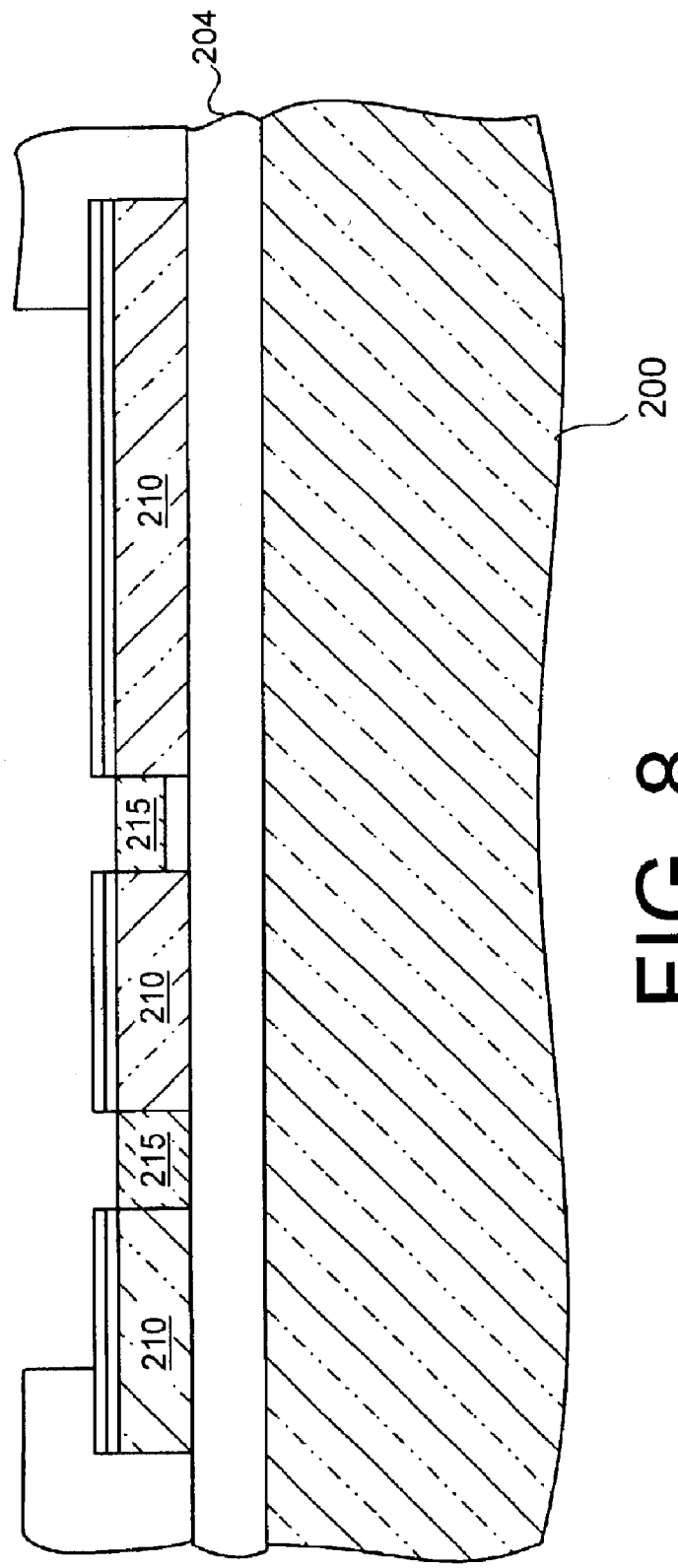

Turning now to FIG. 8, the wafer portion 200 is illustrated after the conductive material has been etched back, leaving only conductive bridges 215 between the SOI islands 210.

Returning to FIG. 1, the next step 114 is to planerize and remove the pad layers. This can be done by depositing a planarization oxide layer to completely fill any remaining features, and then polishing the planarization oxide. This planarization can also be used to planerize the top surface of STI structures at this time. The pad layers can then be removed using a suitable process.

Figure 9:
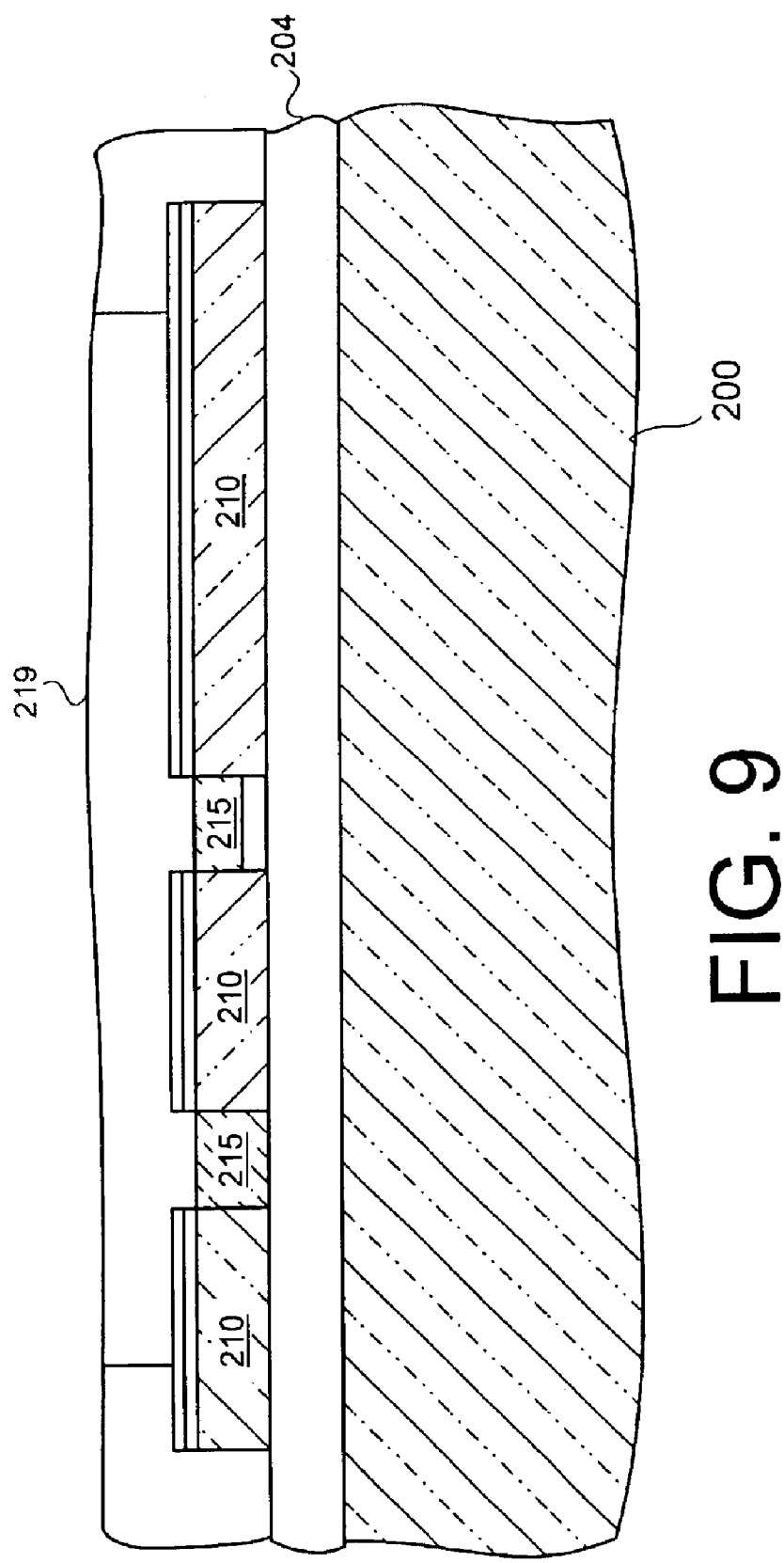
Figure 10:
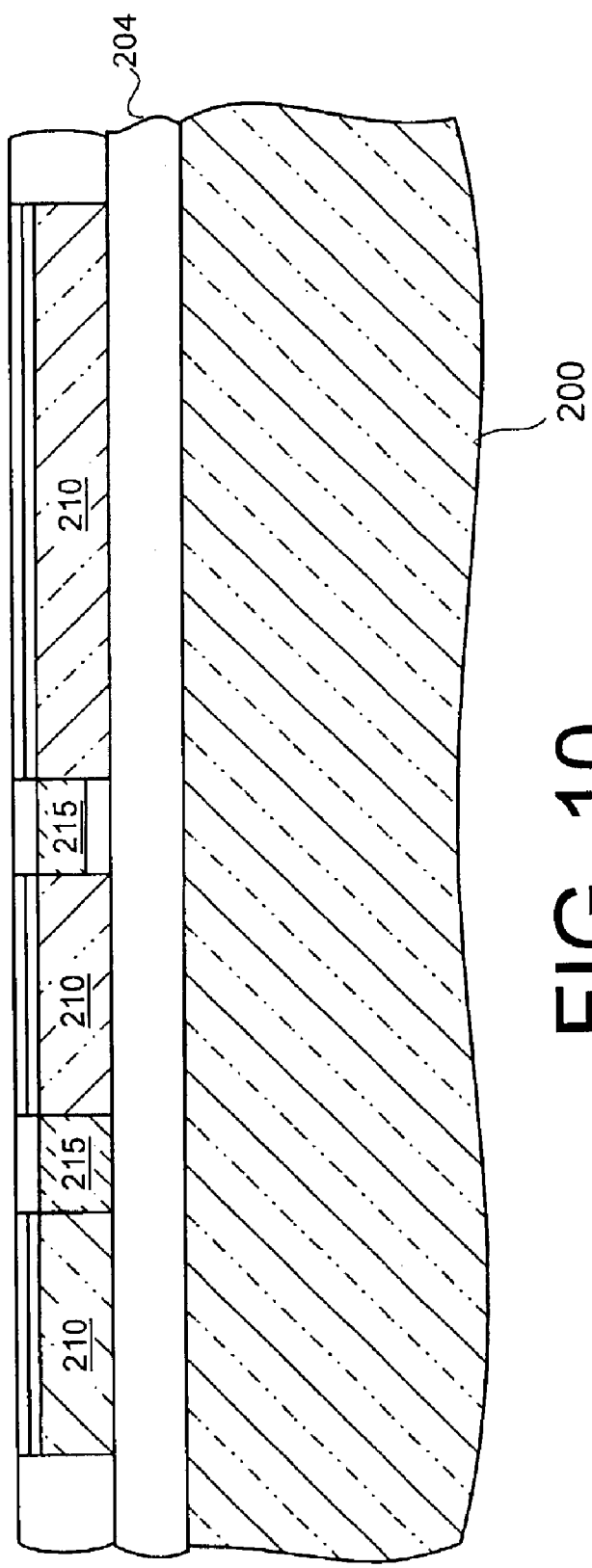
Figure 11:
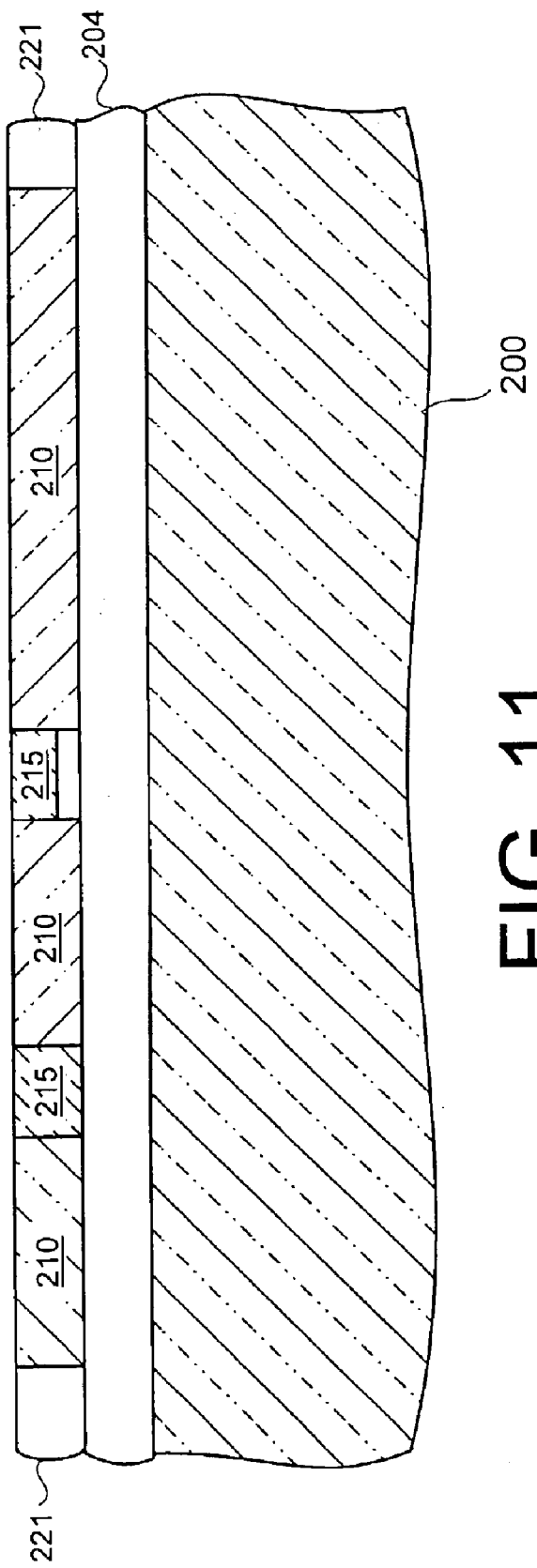

Turning now to FIGS. 9, 10 and 11, the wafer portion is illustrated after the deposition of a planarization oxide 219, after the planarization of the planarization oxide 219, and after the stripping of pad layers 206 and 208. This leaves the wafer with SOI islands 210, connected by conductive bridges 215. Also formed are STI structures 221 at the edges of the active region. Each individual SOI islands is strained, causing an increase in hole mobility. However, the SOI islands are connected, thus minimizing the need for additional external contacts. P-channel transistors can now be formed on the SOI islands. The P-channel transistors will have an increased gain resulting from the increased hole mobility. The transistors can be formed using any suitable process, but an exemplary process will be given as part of method 100.

Returning to FIG. 1, the next step 116 is to form and pattern gate stacks to define the gates the transistors. This would typically involve the formation of a gate dielectric, such as by growing gate oxide. A gate conductor would then be deposited. The gate conductor can comprise any suitable conductor, such as polysilicon. Additionally, the gate stack may comprise polysilicon with tungsten silicide thereon, or may consist entirely of a metal The gate stack is then patterned to define individual gates.

Figure 12:
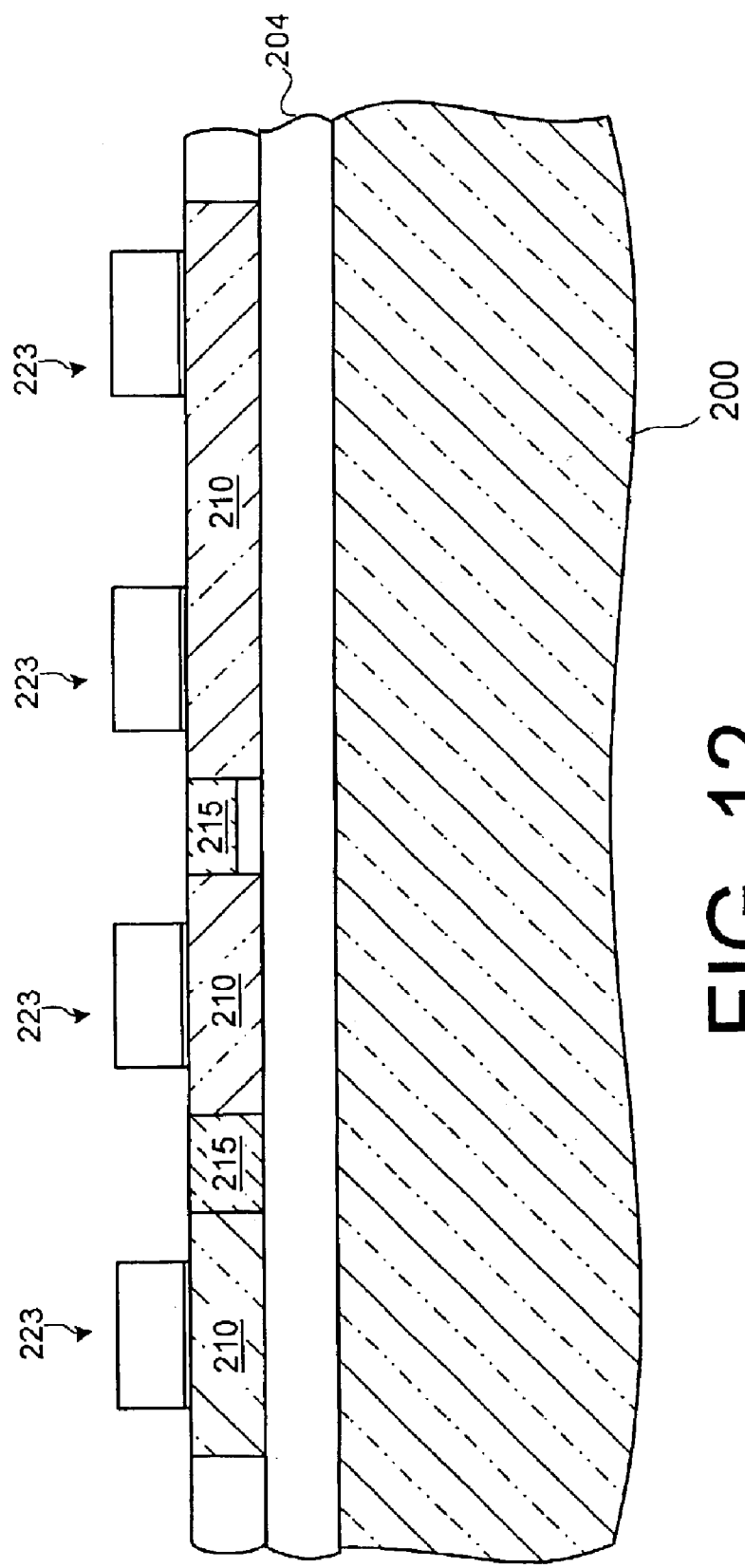

Turning now to FIG. 12, the wafer portion 200 is illustrated after gate dielectric and gate conductor layers have been deposited and patterned to form gates 223.

Figure 13:
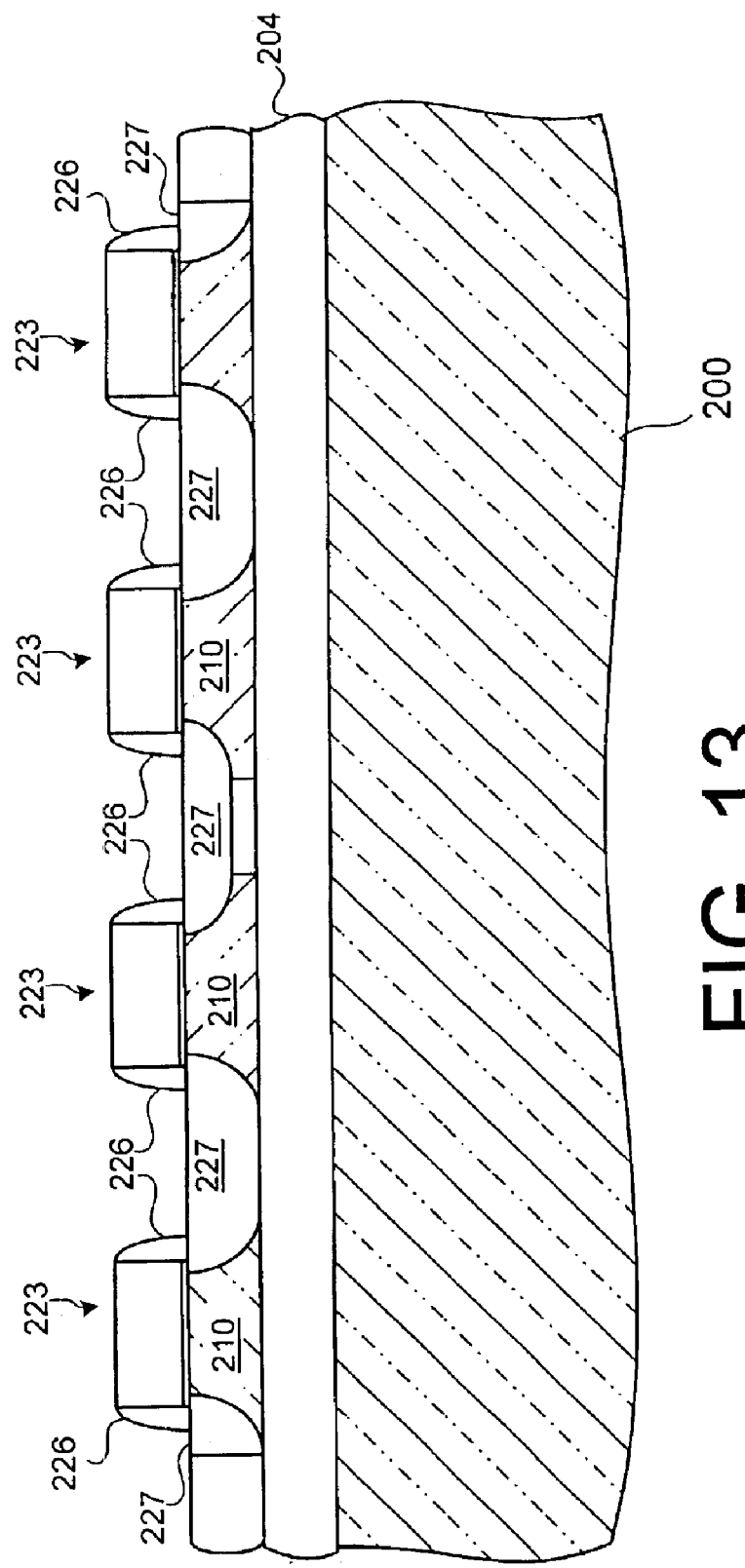

Returning to FIG. 1, the next step 118 is to form sidewall spacers and form source/drain implants. This is typically done by conformally depositing a spacer dielectric, and then performing a directional etch. This leaves material on the sidewalls of the gates, while removing it from the horizontal surfaces. A suitable source/drain implant is then made. This same implant can be used to dope the conductive bridges between the SOI islands, as well as the gates. Turning now to FIG. 13, the wafer portion 200 is illustrated after sidewall spacers 226 and source/drain implants 227 have been formed. It will generally be desirable to form the source/drain implants 227 to a depth equal to the bottom of SOI layer 210. This minimizes leakage between devices that share a silicon island, which could otherwise result in inferior switching speeds. However, it should be noted that between devices that are not on the same silicon islands (i.e, where the conductive bridges are formed), the depths of the source/drain implants can extend to less than the bottom of the SOI layer 210 without resulting in excessive leakage, since the conductive bridge will block any patch between adjacent FET bodies. Furthermore, in locations where the conductive bridges are formed over a remaining portion of the STI dielectric, the remaining portion of STI dielectric allows the source/drain implants to be even shallower without resulting in excessive leakage.

Returning to FIG. 1, the next step 120 is to form a conductive top layer over the conductive bridges. This can be done with any suitable material. The conductive top layer improves the conductivity of the connection between silicon islands and thus allows for flexibility in choosing where subsequent contacts are made to the source/drain regions without adding substantial resistance in series with the FETs. The conductive top layer can be formed from any layer of conductive material. Generally, it is preferable to form the conductive top layer from silicide. This is typically done formed by depositing an appropriate metal such as titanium, tungsten and/or cobalt, and reacting the metal to form a reaction production product. For example, silicide can be formed depositing the metal over a polysilicon conductive bridge and the adjacent portions of the SOI islands, and then annealing the wafer at temperatures typically between 600° C. and 750° C. This forms silicide compound in those regions where the metal overlies silicon directly. In particular, this forms silicide only where silicon was formed, and thus only over the SOI islands and conductive bridges, and over the gate portions of the device. The remaining portions of metal are then removed by an etch which selectively removes the unreacted metal but leaves the metal silicide compound.

Figure 14:
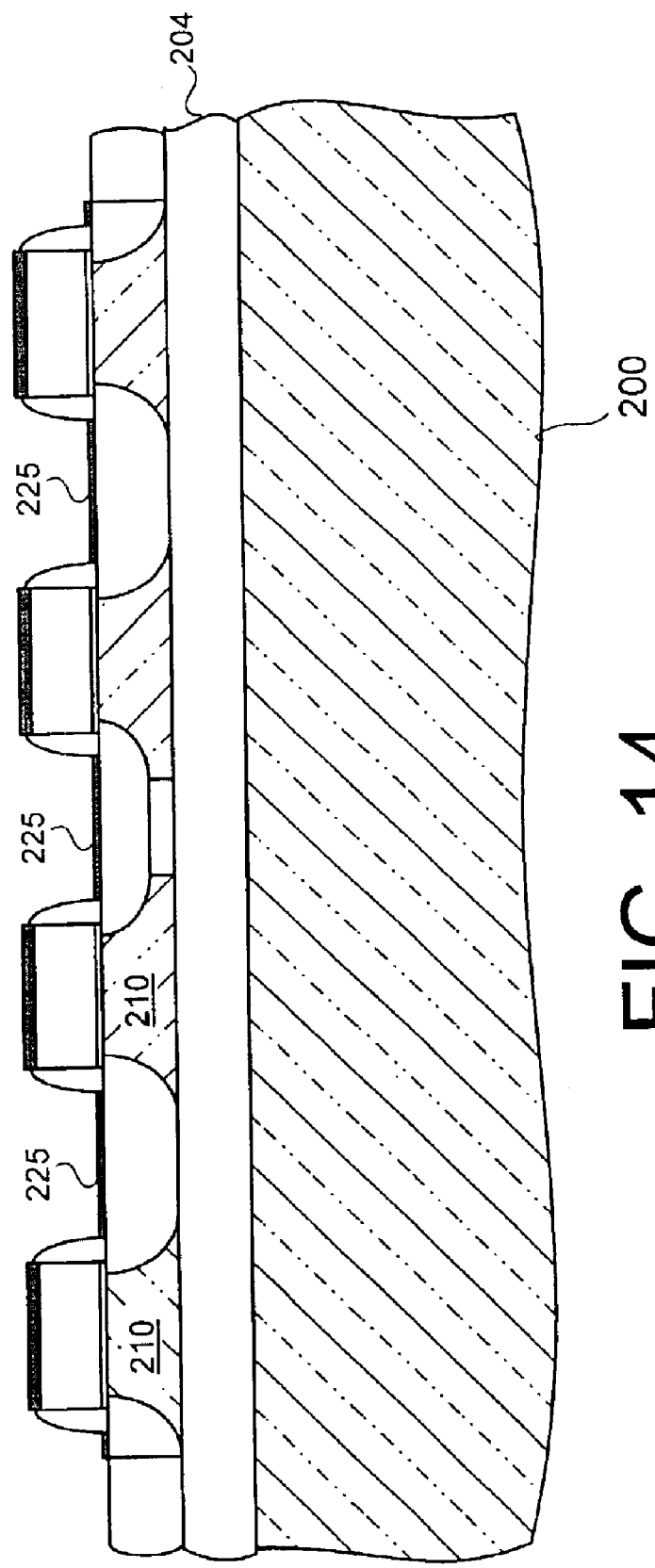

Turning to FIG. 14, the wafer portion 200 is illustrated after the formation of conductive top layers 225. These conductive top layers 225 are preferably a silicide such as titanium silicide or cobalt silicide.

Returning to method 100, the next step 122 is to form an insulative layer above the structure. Then, in step 124, the insulative layer is patterned to form vias that connect the various devices, and complete back end of line processing.

The embodiments of the present invention thus provides device design and method for forming Field Effect Transistors (FETs) that have improved performance without negative impacts to device density. The present invention forms high-gain p-channel transistors by forming them on silicon islands where hole mobility has been increased. The hole mobility is increased by applying physical straining to the silicon islands. By straining the silicon islands, the hole mobility is increased resulting in increased device gain. This is accomplished without requiring an increase in the size of the devices, or the size of the contacts to the devices.

The invention forms silicon islands from a silicon-on-insulator (SOI) layer. The silicon islands are preferably defined to minimize the size of the islands and to increase and equalize the amount of induced strain that is applied to the silicon islands during processing. For example, strain is applied by growing oxide at the edges of the silicon islands. The oxide causes the silicon islands to flex upward, increasing the strain on the silicon islands. Normally, devices positioned far away from the edges of such silicon islands will experience very little strain, and hence, ordinary hole mobility. Devices near the edge of silicon islands will experience large strain, and hence will enjoy significant mobility enhancement. In the present invention, the dimensions of the silicon islands are minimized and the strain caused by the oxide growth is applied across the silicon island and thus effects all transistors formed in the island. Thus, PFETs formed in the strained silicon island have an increased hole mobility and hence an increased gain. Furthermore, the gain of the PFETs caused by the device strain is equalized, resulting in equalized device performance.

The strained silicon islands are connected together to reduce the number of contacts needed to connect the transistors. The strained silicon islands are connected by forming conductive bridges in the trenches between the strained silicon islands. For example, polysilicon bridges are formed in the trenches between strained silicon islands. In addition, a second conductive top layer can be formed atop the conductive bridges to further increase the conductivity between islands. For example, silicide can be formed atop the conductive bridges, further increasing the conductivity between adjacent conductive bridges.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. For example, The description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

What is claimed is:

1. A method of forming a semiconductor substrate, the method comprising the steps of:
   providing a semiconductor wafer, the semiconductor wafer having an SOI layer and a buried insulator layer;
   patterning the semiconductor wafer to define at least a first SOI island and a second SOI island, the patterning forming a trench between the first SOI island and the second SOI island;
   straining the first and second SOI islands; and
   forming a conductive bridge in the trench.

2. The method of claim 1, comprising the steps of:
   forming a first gate structure on the first SOI island, and a second gate structure on the second SOI island; and
   forming a source/drain implant between the first gate structure and the second gate structure, wherein the source/drain implant is formed extending across the conductive bridge between the first SOI island and the second SOI island.

3. The method of claim 1, wherein the step of straining the first and second SOI islands comprises forming silicon dioxide at a bottom edge of the first and second SOI islands.

4. The method of claim 1, wherein the stop of forming a conductive bridge in the trench comprises depositing polysilicon in the trench.

5. The method of claim 1, further comprising the step of forming an insulative layer at a bottom of the trench.

6. The method of claim 1, further comprising forming a conductive top layer of the conductive bridge.

7. The method of claim 6, wherein the step of forming the conductive top layer comprises depositing a metal on the conductive bridge and adjacent portions of the first and second SOI islands, and reacting the metal to form silicide.

8. The method of claim 1, further comprising forming an implant that extends at least partially into said conductive bridge.

9. The method of claim 8, wherein the step of patterning the semiconductor wafer to define at least the first SOI island and the second SOI island defines a third SOI island and forms a second trench between the first SOI island and the third SOI island, said method further comprising the steps of:

straining the third SOI island;

forming a second conductive bridge in the second trench; and forming a second implant that extends at least partially into the second conductive bridge.

10. The method of claim 1, wherein the straining step comprises the first and second SOI islands by growing oxide at edges of the first and second SOI islands causing the edges of the first and second SOI islands to flex upward.

11. The method of claim 1, wherein the straining step comprises straining the first and second SOI islands by depositing a first and second layer on the first and second SOI island, respectively, and wherein the first and second layer have a coefficient of thermal expansion (CTE) that differs from a CTE of the first and second SOI islands.

12. The method of claim 1, wherein the straining step comprises straining the first and second SOI islands by introducing germanium in selected areas of the first and second SOI islands to induce controllable strain in the first and second SOI islands.

13. The method of claim 1, wherein the straining step is performed before the step of forming the conductive bridge.

14. The method of claim 1, further comprising forming an insulating layer over the first and second SOI islands and on the conductive bridge such that the insulating layer is in direct mechanical contact with the conductive bridge.

15. The method of claim 1, wherein the step of forming the conductive bridge comprises forming the conductive bridge such that the conductive bridge is in direct mechanical and electrical contact with the first and second SOI islands.

16. The method of claim 15, wherein the straining step is performed before the step of forming the conductive bridge.

17. The method of claim 15, further comprising forming an insulating layer over the first and second SOI islands and on the conductive bridge such that the insulating layer is in direct mechanical contact with the conductive bridge.

* * * * *

UNITED STATES PATENT AND TRADEMARK OFFICE
CERTIFICATE OF CORRECTION

PATENT NO. : 6,962,838 B2
DATED : November 8, 2005
INVENTOR(S) : Anderson et al.

It is certified that error appears in the above-identified patent and that said Letters Patent is hereby corrected as shown below:

Column 5,
Line 31, delete "flow" and insert -- now --.

Column 8,
Line 54, delete "stop" and insert -- step --.

Signed and Sealed this

Twenty-fourth Day of January, 2006

JON W. DUDAS
*Director of the United States Patent and Trademark Office*